(12) United States Patent
Chen

(10) Patent No.: US 10,135,402 B1
(45) Date of Patent: Nov. 20, 2018

(54) GROUNDING STRUCTURE AND GROUNDING METHOD OF VACUUM TUBE AUDIO AMPLIFIER

(71) Applicant: ECHOWELL ELECTRONIC CO., LTD., New Taipei (TW)

(72) Inventor: Hsi-Hsien Chen, New Taipei (TW)

(73) Assignee: ECHOWELL ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 15/692,209

(22) Filed: Aug. 31, 2017

(51) Int. Cl.
  *H03F 1/02* (2006.01)
  *H03F 1/28* (2006.01)
  *H03F 3/181* (2006.01)

(52) U.S. Cl.
  CPC .............. *H03F 1/28* (2013.01); *H03F 1/0216* (2013.01); *H03F 3/181* (2013.01); *H03F 2200/03* (2013.01); *H03F 2200/541* (2013.01)

(58) Field of Classification Search
  None
  See application file for complete search history.

(56) References Cited

U.S. PATENT DOCUMENTS 2,955,261 A * 10/1960 Edwards ................. H03F 3/181
                                                              330/117
5,604,461 A * 2/1997 Rozenblit ................. H03F 1/02
                                                              330/81

* cited by examiner

*Primary Examiner* — Curtis A Kuntz
*Assistant Examiner* — Kenny H Truong
(74) *Attorney, Agent, or Firm* — Locke Lord LLP; Tim Tingkang Xia, Esq.

(57) ABSTRACT

The invention provides a grounding structure and a grounding method for a vacuum tube audio amplifier, the grounding structure and the grounding method including: with respect to a power source, utilizing a power circuit without a choke, an anti-coupling circuit, and a filament voltage regulator circuit; and with respect to the grounding method, utilizing an negative output terminal of an audio output transforming circuit or a negative terminal of a filter capacitor in the power circuit as a single ground terminal of the vacuum tube audio amplifier, and not arranging a grounding metal bottom plate therein, in order to achieve a compact, lightweight desktop model of a vacuum tube audio amplifier.

14 Claims, 10 Drawing Sheets

200 Volt/ large grid

200 Volt/ large grid

10 Milivolt/ large grid

10 Milivolt/ large grid

10 Milivolt/ large grid

GROUNDING STRUCTURE AND GROUNDING METHOD OF VACUUM TUBE AUDIO AMPLIFIER

BACKGROUND OF THE INVENTION

Field of the Invention

The present invention relates to an audio amplifier and more particularly to a light-weight vacuum tube audio amplifier.

Description of the Prior Art

Vacuum tubes have excellent linear output characteristics, so a conventional vacuum tube audio amplifier that uses vacuum tubes for processing audio signals can provide superior sound quality. See the circuit structure of a conventional vacuum tube audio amplifier as exemplified in FIG. 1. A conventional vacuum tube audio amplifier receives an audio signal input 1 and then outputs the signal to a loudspeaker 4. Moreover, the conventional vacuum tube audio amplifier includes a power circuit 5, a vacuum tube amplifying circuit 2, an audio output transforming circuit 3, and a grounding metal bottom plate 6, wherein the power circuit 5 is utilized to receive a mains electricity input 7 and provide power to the vacuum tube amplifying circuit 2 and the audio output transforming circuit 3. The grounding metal bottom plate 6 is employed to provide grounding shield to the power circuit 5, the vacuum tube amplifying circuit 2, and the audio output transforming circuit 3.

See FIG. 2 for an illustration of a circuit diagram of the conventional vacuum tube audio amplifier, wherein with respect to power source, the mains electricity input 7 is transformed and rectified through the power circuit 5, filtered by a choke (CHK) and then provided to the vacuum tube amplifying circuit 2 and the audio output transforming circuit 3. An audio signal input 1 is amplified by the vacuum tube amplifying circuit 2, transformed by the audio output transforming circuit 3 and then transmitted to the loudspeaker 4. With respect to grounding, point A in the power circuit 5, or the negative terminal (point B) of the input terminal signal of the vacuum tube amplifying circuit 2 is used as the only ground terminal in a conventional vacuum tube audio amplifier to be coupled with a single ground terminal with the grounding metal bottom plate 6 to provide grounding shield to the conventional vacuum tube audio amplifier.

However, even though the grounding metal bottom plate 6 of a conventional vacuum tube audio amplifier may provide grounding shield, it cannot eliminate the residual AC noise and impulse noise, resulting in that the user could hear clearly the residual hum and impulse hum in the sound played by the loudspeaker 4 at a short distance (within about a meter). Also, the choke in the power circuit 5 would be coupled with high-frequency noise and further aggravate the problem of humming. Moreover, the grounding metal bottom plate 6 results in huge volume of the amplifier and expensive cost, and as the grounding metal bottom plate 6 is mostly designed integrally with the casing, which further leads to leakage in a conventional vacuum tube audio amplifier. Even though the conventional vacuum tube audio amplifier has superior sound quality, due to bulky volume and the problem of humming within a short distance, a desktop model cannot be developed nor do such vacuum tube audio amplifiers fit in ordinary households.

SUMMARY OF THE INVENTION

The present invention provides a grounding structure and method of a vacuum tube audio amplifier, which reduces the residual noise of the vacuum tube audio amplifier with respect to power source and ground to effectively address the problem of hum. The vacuum tube audio amplifier is not arranged with a grounding metal bottom plate, so as to compact the body of the amplifier and further avoid leakage.

Hence, with the grounding structure of the vacuum tube audio amplifier of the present invention, the vacuum tube audio amplifier may achieve compactness and improve the problem of hum, realizing a light-weight desktop model of the vacuum tube audio amplifier.

To deal with the above issues, a grounding structure of the vacuum tube audio amplifier is provided by the present invention. The vacuum tube audio amplifier transmits an output signal according to an input signal, and includes a power circuit that supplies power to a vacuum tube amplifying circuit and an audio output transforming circuit. The audio output amplifying circuit amplifies the input signal and transmits it to the audio output transforming circuit, which delivers the output signal to the loudspeaker. Besides, the negative output terminal of the audio output transforming circuit or the negative terminal of a filter capacitor in the power circuit is used in the vacuum tube audio amplifier as the single ground terminal, which is not coupled to a grounding metal bottom plate. Also, through a filament voltage regulator circuit, the power is supplied to a filament of a vacuum tube in the vacuum tube audio amplifying circuit.

To address the above issues, a grounding structure of a vacuum tube audio amplifier is provided in the present invention. The vacuum tube audio amplifier transmits an output signal according to an input signal, and includes a power circuit that supplies power to the vacuum tube amplifying circuit and the audio output transforming circuit. The vacuum tube amplifying circuit amplifies an input signal and transmits it to the audio output transforming circuit, which delivers the output signal to the loudspeaker. Besides, a negative output terminal of the audio output transforming circuit or a negative terminal of a filter capacitor in the power circuit is used as the single ground terminal of the vacuum tube audio amplifying circuit; the single ground terminal is not coupled to a grounding metal bottom plate; and through a filament voltage regulator circuit, the power is supplied to a filament of a vacuum tube in the vacuum tube amplifying circuit.

The previously described aspects rendered in the following detailed explanations of the non-limiting, substantive embodiments in accordance with the present invention with the accompanying drawings will provide a better understanding of the present invention.

DETAILED DESCRIPTION OF THE PREFERRED EMBODIMENTS

The present invention provides a grounding structure and method of a vacuum tube audio amplifier, with a view to realizing a lightweight desktop model of the vacuum tube audio amplifier. With respect to power source, the grounding structure and method of the vacuum tube audio amplifier include utilizing a power circuit without a choke, an anti-coupling circuit and a filament voltage regulator circuit to lower the residual noise of the vacuum tube audio amplifier so as to effectively reduce the hum. With respect to grounding, the grounding structure and method of the vacuum tube audio amplifier utilize the negative output terminal of the audio output transforming circuit or the negative terminal of the filter capacitor in the power circuit as the single ground terminal, and a grounding metal bottom plate is not arranged in the vacuum tube audio amplifier in order to reduce noise, prevent power leakage, and thereby achieve a compact body for a vacuum tube audio amplifier.

Figure 1:
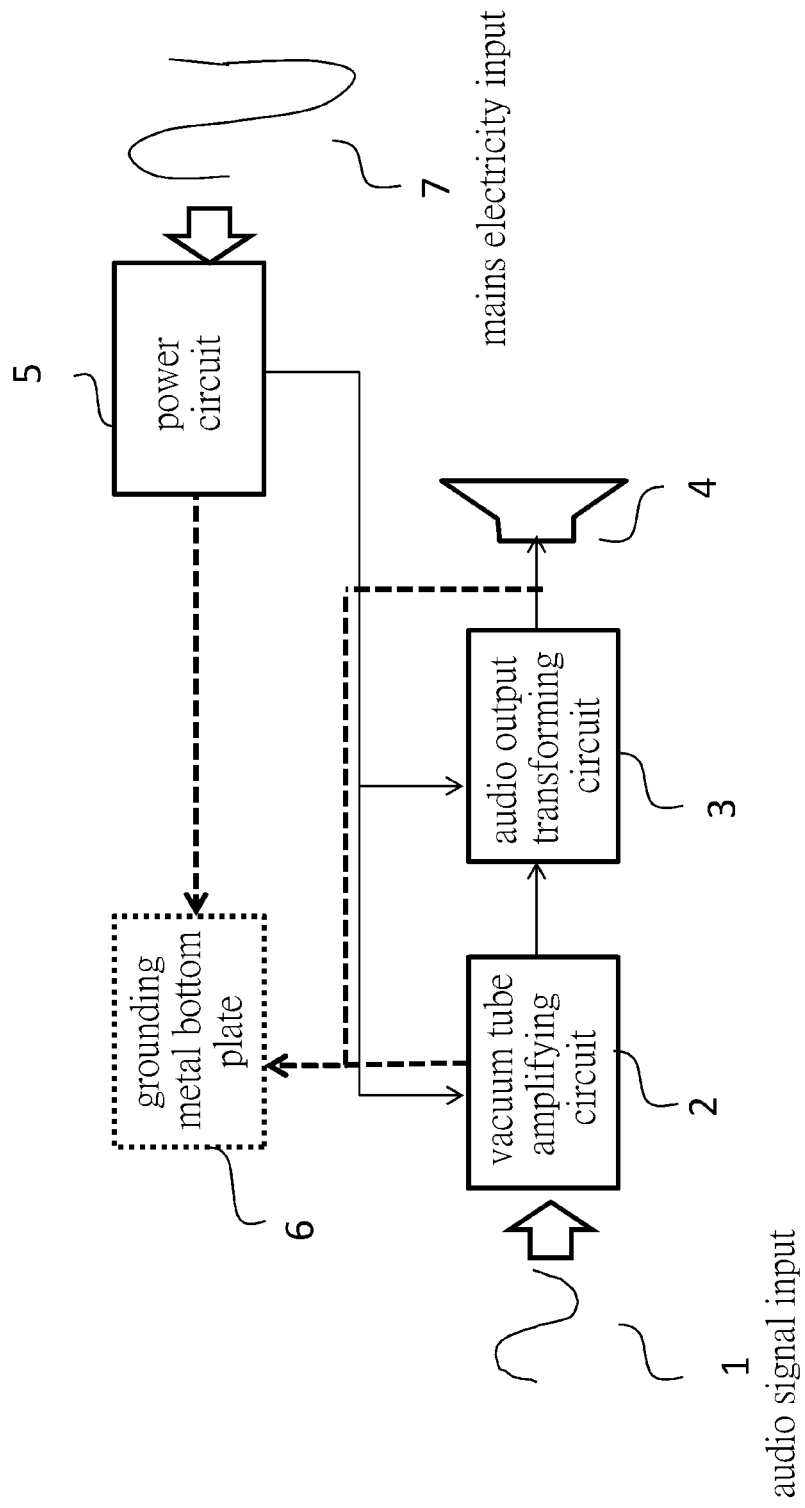
FIG. 1 is the circuit structure diagram of a conventional vacuum tube audio amplifier.
Figure 2:
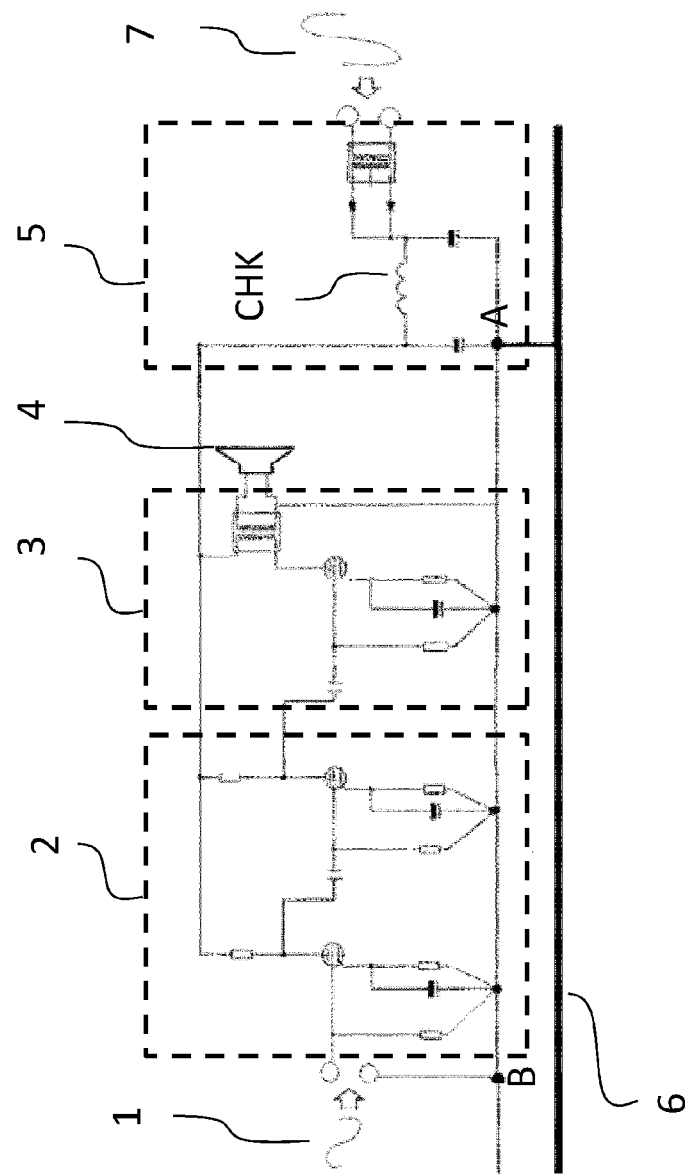
FIG. 2 is a circuit diagram of the conventional vacuum tube audio amplifier.
Figure 3:
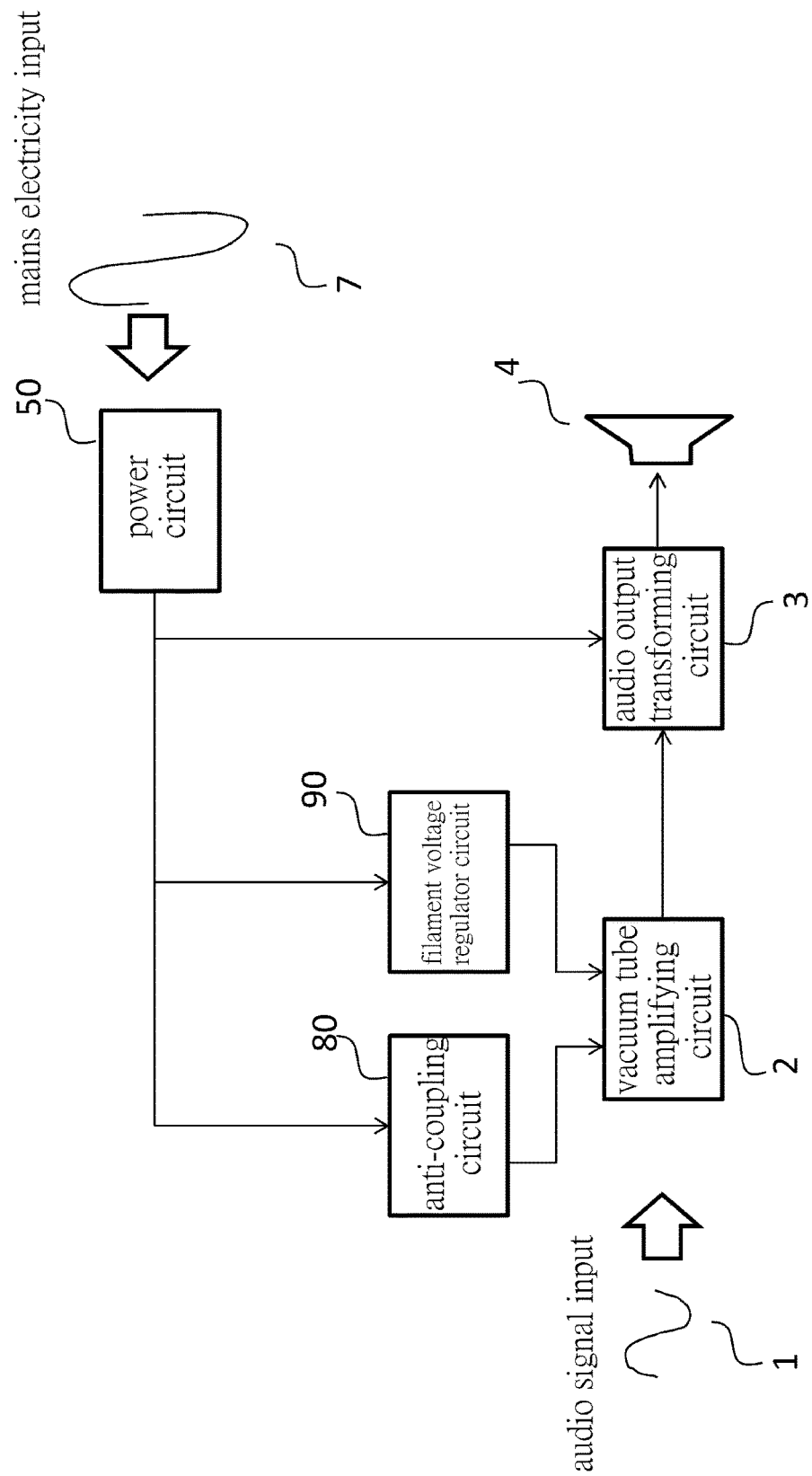
FIG. 3 is a circuit structure diagram of a vacuum tube audio amplifier according to the present invention.

FIG. 3 is a circuit structure diagram of the vacuum tube audio amplifier according to the present invention, wherein the vacuum tube audio amplifier includes a power circuit 50, an anti-coupling circuit 80, a filament voltage regulator circuit 90, a vacuum tube amplifying circuit 2, and an audio output transforming circuit 3.

The grounding structure of the vacuum tube audio amplifier according to the present invention. With respect to power source, the power circuit 50 receives the mains electricity input 7, and carries on transforming, rectifying, and filtering, and then supplies the power to the vacuum tube amplifying circuit 2 and the audio output transforming circuit 3, wherein the power circuit 50 does not include a choke. Particularly, the power is first anti-coupled and filtered by the anti-coupling circuit 80 before being supplied to the vacuum tube amplifying circuit 2. Besides, the vacuum tube voltage amplifier stage in the vacuum tube amplifying circuit 2 requires a filament voltage, furthermore, the filament voltage is processed by the filament voltage regulator circuit 90, and then the power is supplied to the voltage amplifier stage vacuum tube in the vacuum tube audio amplifying circuit.

Figure 4:
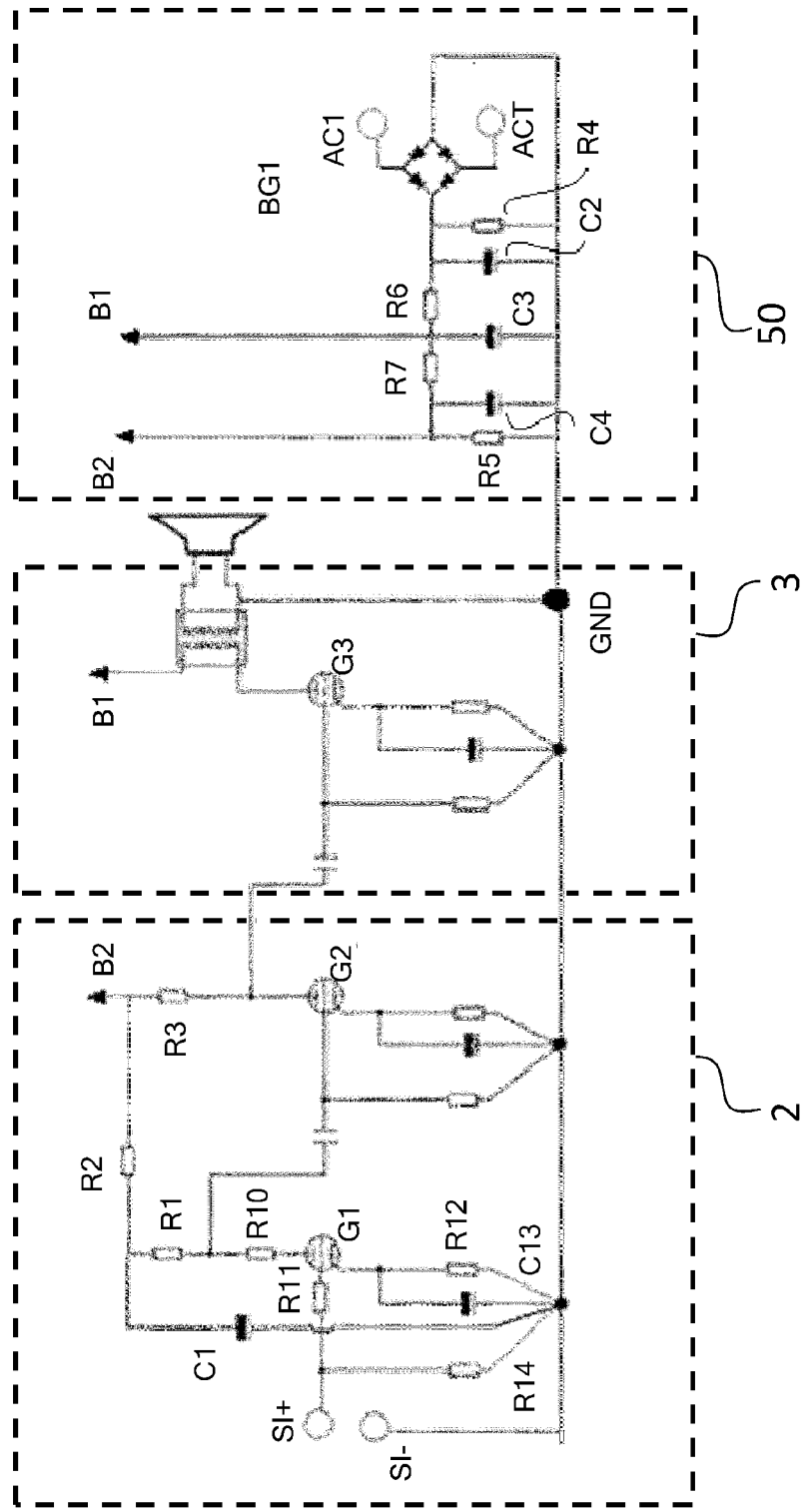
FIG. 4 is a circuit diagram of the vacuum tube audio amplifier according to the present invention.
Figure 5:
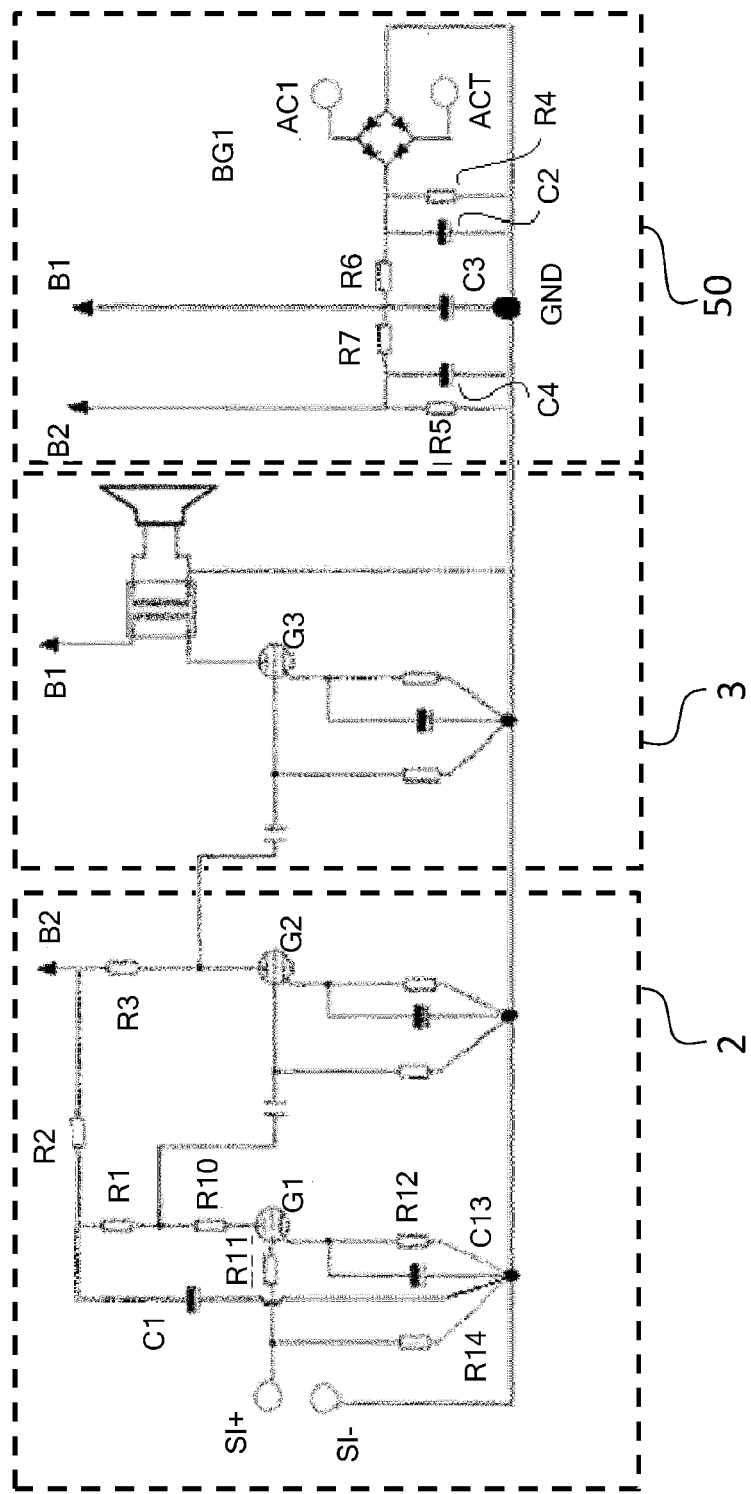
FIG. 5 is a circuit diagram of another vacuum tube audio amplifier according to the present invention.

The grounding structure of the vacuum tube audio amplifier according to the present invention. With respect to grounding, the grounding junctions in the vacuum tube audio amplifier are all coupled to the negative output terminal of the audio output transforming circuit 3 (as shown in FIG. 4), or are all coupled to the negative terminal of the filter capacitor in the power circuit 50 (as shown in FIG. 5). The negative output terminal of the audio output transforming circuit 3 or the negative terminal of the filter capacitor in the power circuit 50 is used as the single ground terminal GND of the vacuum tube audio amplifier, and the single ground terminal GND is merely coupled to a ground terminal of PCBA (Print Circuit Board Assembly) and is not coupled to the grounding metal bottom plate.

With the above-described grounding structure and method of a vacuum tube audio amplifier, the vacuum tube audio amplifier may, under the condition of low residual noise and impulse noise, receive and amplify an audio signal input 1 by the vacuum tube amplifying circuit 2, transform it through the audio output transforming circuit 3 and then transmit the signal to the loudspeaker 4. Hence, the hum in the sound played by the loudspeaker 4 may be reduced so as to allow the listener to hear the superb sound quality of the vacuum tube audio amplifier at a short distance.

FIG. 4 illustrates the circuit of the vacuum tube audio amplifier according to the present invention. The mains electricity input is entered from an AC1 terminal and an ACT terminal into the power circuit 50 and transformed by the transformer (see 50A in FIG. 6), and then the AC power source is rectified by a rectifier BG1 to a DC power source and filtered through a filter circuit.

To avoid the choke being coupled with high-frequency signals and producing noise, a choke is not disposed in the filter circuit of the power circuit 50 of the present invention. With reference to FIG. 4, the rectifier BG1 is a bridge rectifier and provides a DC voltage from the positive terminal to the negative terminal. Moreover, a terminal of the resistor R4, a terminal of a resistor R6, and a terminal of a capacitor C2 are coupled to the positive output terminal of the rectifier BG1. The other terminal of the resistor R6 is coupled to a terminal of a filter capacitor C3 and a terminal of a resistor R7; the other terminal of the resistor R7 is coupled to a terminal of a capacitor C4 and a terminal of a resistor R5. The other terminal of each of the resistor R4, resistor R5, capacitor C2, filter capacitor C3, and capacitor C4 is coupled to the negative terminal of the rectifier BG1 to create a filter circuit without a choke. And the other terminal of the resistor R6 is coupled to the junction of the filter capacitor C3 and a DC power source B1 is output wherefrom, and the other terminal of the resistor R7 is coupled to a terminal of the capacitor C4 and a terminal of the resistor R5 and a DC power source B2 is output wherefrom, wherein the impulse noise in the DC power sources B1 and B2 may be filtered by the filter circuit. In one embodiment, the filter capacitor C3 is an electrolytic capacitor with a high capacitance value to filter impulse noise. In another embodiment, the filter capacitor C3 is on the order of at least 100 uF.

With reference to FIG. 4, the DC power source B2 may supply power to vacuum tubes G1 and G2 in the vacuum tube amplifying circuit 2. Particularly, when the DC power source B2 supplies power to the vacuum tube G1 in the first amplifier stage of the vacuum tube amplifying circuit 2 through an anti-coupling circuit 80, wherein, the DC power source B2 supplies power through the resistor R3 to the vacuum tube G2 in the second amplifier stage, and the DC power source B2 is coupled to a terminal of the resistor R2 to lower the voltage of the DC power source B2. The other terminal of the resistor R2 is coupled to a terminal of the resistor R1 and a terminal of the capacitor C1, the other terminal of the capacitor C1 is coupled to the negative output terminal of the audio output transforming circuit 3, and the other terminal of the resistor R1 is coupled to the plate of the vacuum tube G1 to supply power to the vacuum tube G1. Hence, when an audio signal input is entered from a positive audio signal input terminal SI+ and a negative audio signal input terminal SI− into the vacuum tube amplifying circuit, it is then amplified by the vacuum tube G1 in the first amplifier stage of the vacuum tube amplifying circuit 2. Under the condition that the resistors R1 and R10 are used as the load circuit of the vacuum tube G1, as the DC power source B2 supplies power to the vacuum tube G1 through a RC anti-coupling circuit 80 composed of at least the resistor R2 and capacitor C1 to further enhance the power stability of the vacuum tube G1, vibration can thus be avoided and the residual noise of the vacuum tube audio amplifier lowered. Besides, the RC anti-coupling circuit can also achieve the objective of filtering ripples. In one embodiment, the capacitor C1 may be an electrolytic capacitor and collocate with a resistor to form a RC anti-coupling circuit. In one embodiment, a RC anti-coupling circuit may be configured around the amplifier stage vacuum tubes. In another embodiment, a RC anti-coupling circuit may be arranged around the vacuum tubes G1 and G2 to optimize the noise-reduction characteristic.

Also, the present invention provides a grounding structure and method of a vacuum tube audio amplifier. FIG. 5 illustrates a circuit diagram of another vacuum tube audio amplifier, wherein the vacuum tube audio amplifier may also use the negative terminal of a filter capacitor C3 in the power circuit 50 as a single ground terminal GND, and the single ground terminal GND is merely coupled to the ground terminal of the PCBA for grounding and is not coupled to the grounding metal bottom plate.

Figure 6:
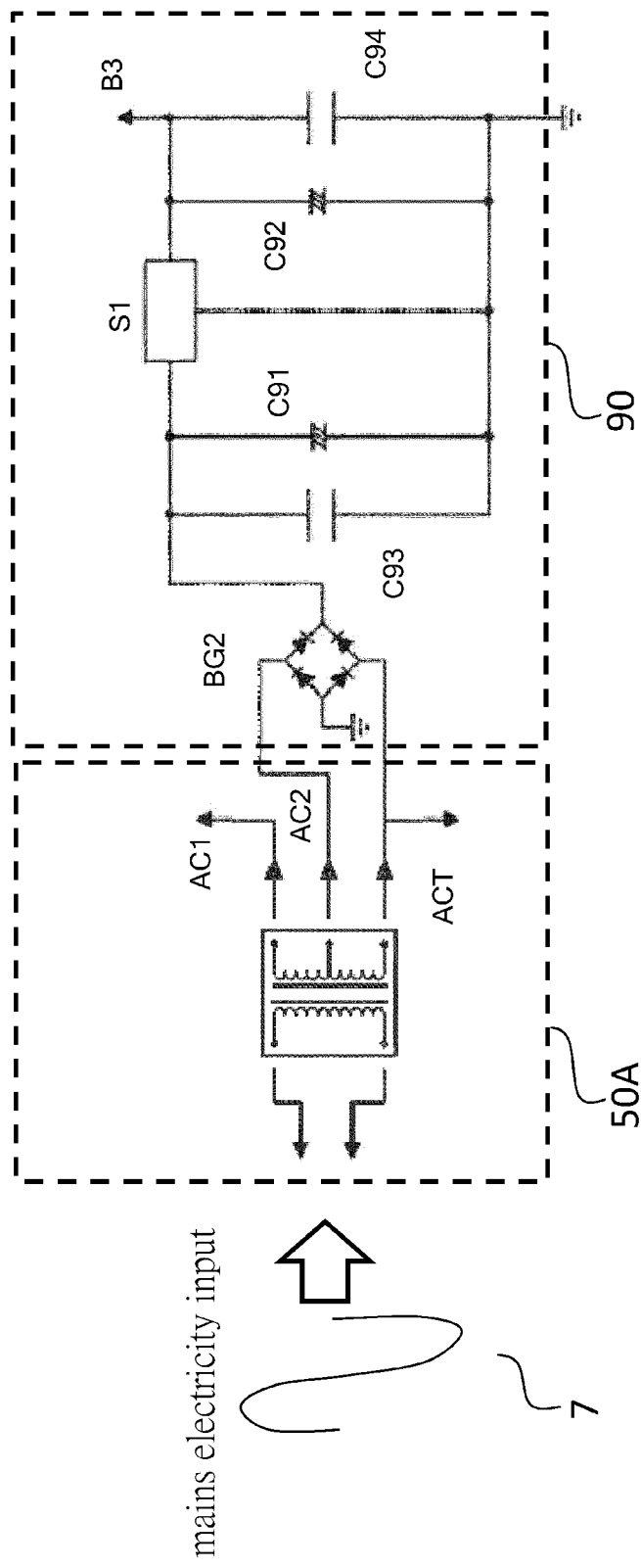
FIG. 6 is a circuit diagram of a filament voltage regulator circuit according to the present invention.

The grounding structure and method of a vacuum tube audio amplifier of the present invention may further include a filament voltage regulator circuit 90. FIG. 6 shows a circuit diagram of a filament voltage regulator circuit of the present invention. When the mains electricity input 7 is entered from the power circuit 50 into the vacuum tube audio amplifier and transformed by a transformer contained in another part of a power circuit 50A, wherein the transformer may include a plurality of taps as needed. The taps may be terminals AC1, AC2 and ACT, wherein terminals AC1 and ACT may be coupled to the rectifier BG1 for rectification, and terminals AC2 and ACT may be coupled to the filament voltage regulator circuit, and by rectification, filtering and regulation, supply steady voltage to the vacuum tubes inside the vacuum tube audio amplifier.

With reference to FIG. 6, terminals AC2 and ACT are coupled to a rectifier BG2 included in the filament voltage regulator circuit 90 for rectification. The positive terminal of the rectifier BG2 is coupled to a terminal of a capacitor C91, a terminal of a capacitor C93 and an input terminal of the voltage regulator circuit S1 for voltage regulation. The output terminal of the voltage regulator circuit S1 may output a steady DC power source B3. Furthermore, the output terminal of the voltage regulator circuit S1 may be coupled to a terminal of a capacitor C92 and a terminal of a capacitor C94, and the other terminal of capacitors C91, C92 and C93 and the ground terminal of the voltage regulator circuit S1 are coupled to the other terminal of the capacitor C94. Therefore, the output terminal of the voltage regulator circuit S1 may supply steady power to the filament terminal in the vacuum tubes of the vacuum tube audio amplifier. In one embodiment, the voltage regulator circuit S1 may be a voltage regulator circuit or a low dropout regulator (LDO). In another embodiment, the voltage regulator circuit S1 may be a LM7806 integrated circuit and steadily output a 6 volts DC power source B3.

The grounding structure and method of a vacuum tube audio amplifier of the present invention, with respect to power source, may supply steady power to the vacuum tubes and may avoid unnecessary coupling or high-frequency coupling. With respect to grounding, a single ground terminal GND is adopted and the single ground terminal GND is merely coupled to the ground terminal of PCBA for grounding and no grounding metal bottom plate is arranged thereof. By realizing the previously described structure and method with respect to power source and grounding, which include eliminating the hum that accompanies the audio signals played through the loudspeaker of the vacuum tube audio amplifier when listened to at a short distance, reducing the weight and cost of the vacuum tube audio amplifier, and retaining the superior sound quality of the vacuum tubes of the vacuum tube audio amplifier, a light-weight desktop model of the compact vacuum tube audio amplifier is thereby achieved.

Figure 7:
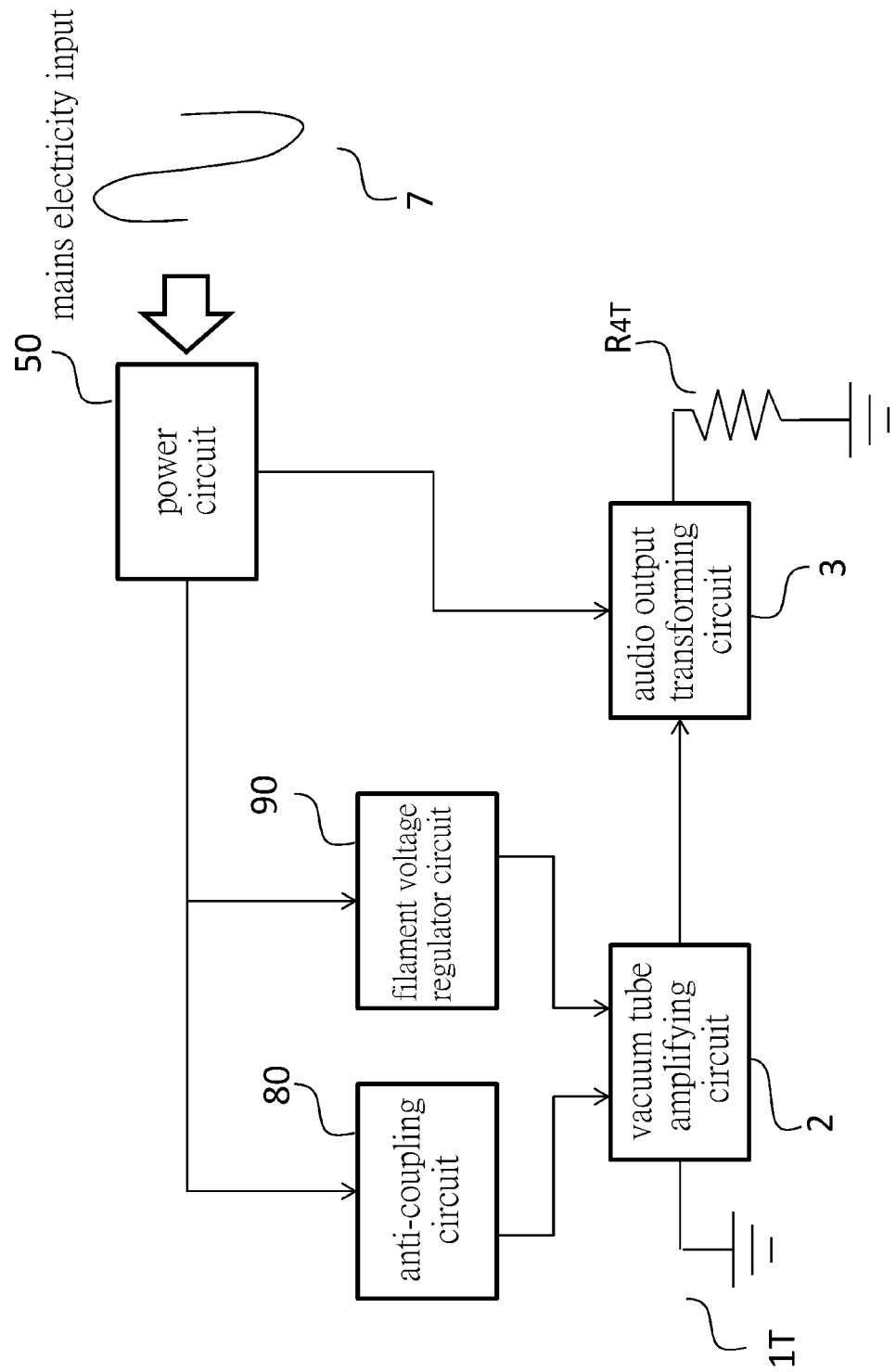
FIG. 7 is a diagram illustrating a measurement circuit structure of the vacuum tube audio amplifier used for measuring the residual noise.

FIG. 7 is a diagram illustrating a measurement circuit structure of the vacuum tube audio amplifier used for measuring the residual noise, wherein the circuit is measured according to the configuration as illustrated in FIG. 4. The power circuit 50 of the vacuum tube audio amplifier receives the mains electricity input 7, the input terminal of the vacuum tube amplifying circuit 2 is grounded, and a load resistor R4T matching an equivalent internal resistor of the loudspeaker 4 is disposed at the output terminal of the vacuum tube audio amplifying circuit 3. Based on this measuring structure, the waveforms and level of the residual noise of the vacuum tube audio amplifier may be measured under the condition that no audio signal is being input into the vacuum tube audio amplifier.

Figure 8A:
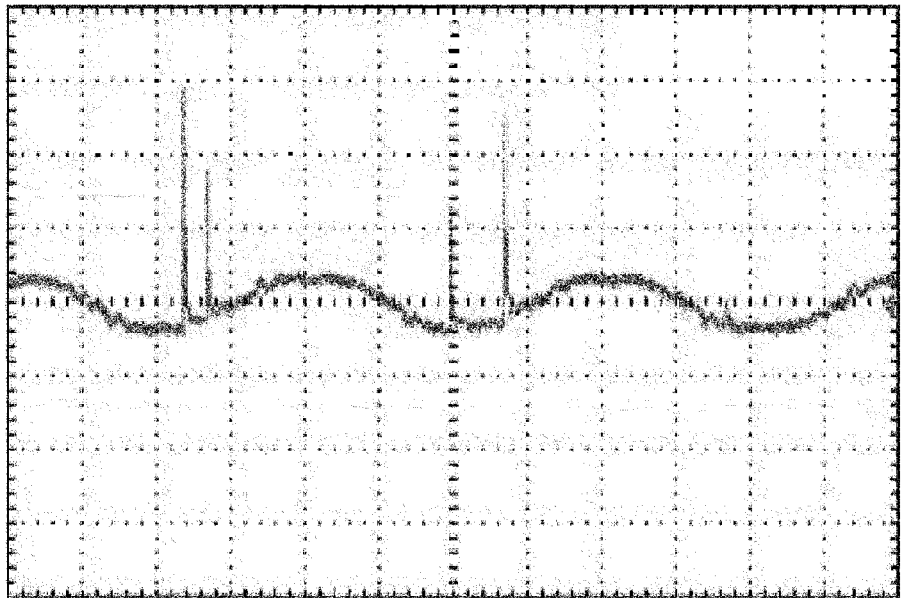
FIG. 8A shows in the conventional vacuum tube audio amplifier according to the measurement circuit structure, measuring an output voltage of a power circuit.
Figure 8B:
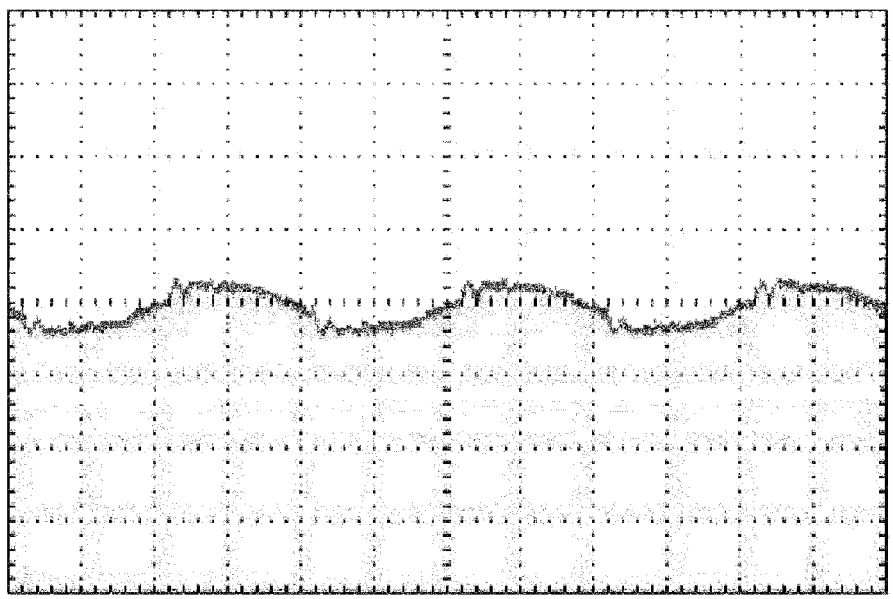
FIG. 8B shows in the vacuum tube audio amplifier of the present invention according to the measurement circuit structure, measuring an output voltage of a power circuit.

A comparison of FIGS. 8A and 8B shows under the same condition (such as the circuit of the power circuit 50 in FIG. 5) the waveforms of the DC power source B1 respectively outputted by a conventional vacuum tube audio amplifier with a choke and by the vacuum tube audio amplifier of the present invention without a choke, wherein, the input AC power source is on the order of ±198 volts at a frequency of 50 Hz; the rectifier BG1 is on the order of KBP208; the resistor R4 is on the order of 220 KΩ; the capacitor C2 is an electrolytic capacitor on the order of 47 uF; the capacitor C3 is an electrolytic capacitor on the order of 120 uF; the capacitor C4 is an electrolytic capacitor on the order of 22 uF; the resistor R7 is on the order of 10 KΩ; and the resistor R5 is on the order of 470 KΩ.

FIG. 8A shows measuring an output voltage of the power circuit in the conventional vacuum tube audio amplifier according to the measurement circuit structure, wherein the power circuit 50 in FIG. 5 is as previously configured, and the resistor R6 is replaced by a choke with an inductance value of 4H and a withstand current of 200 mA. FIG. 8A clearly shows the output of the DC power source B1 is accompanied by high-frequency impulse noise, thus inducing high-frequency hum in the audio signals output by the vacuum tube audio amplifier and is disadvantageous to the use of a vacuum tube audio amplifier at a short distance.

FIG. 8B shows in the vacuum tube audio amplifier of the present invention according to the measurement circuit structure, measuring an output voltage of the power circuit, wherein the power circuit 50 in FIG. 5 is configured as previously described, and the resistor R6 is 100Ω. FIG. 8 clearly shows that the signals output by the DC power source B1 do not contain impulse noise, which facilitates the use of the vacuum tube audio amplifier at a short distance.

Figure 9A:
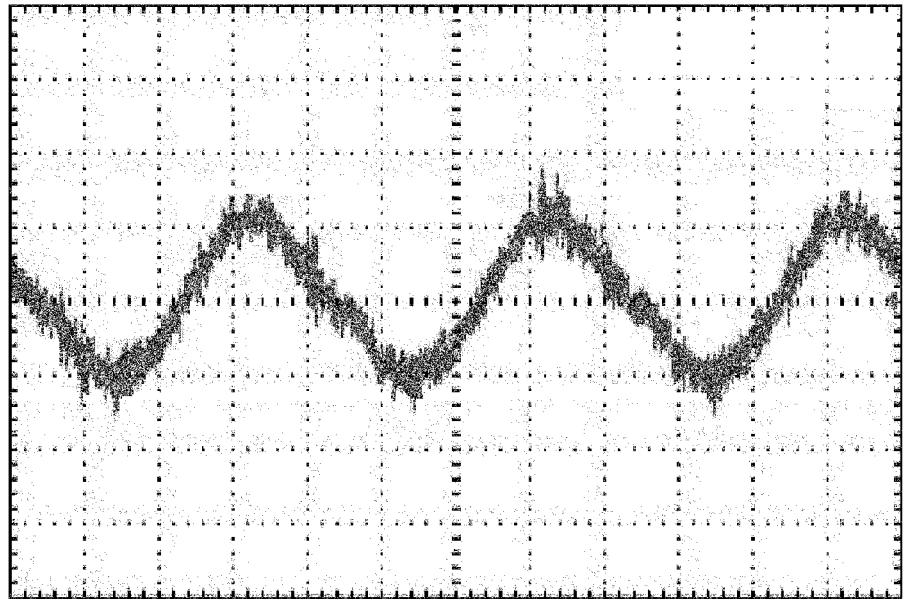
FIG. 9A shows in the conventional vacuum tube audio amplifier according to the measurement circuit structure, measuring a residual noise of a single ground terminal.
Figure 9B:
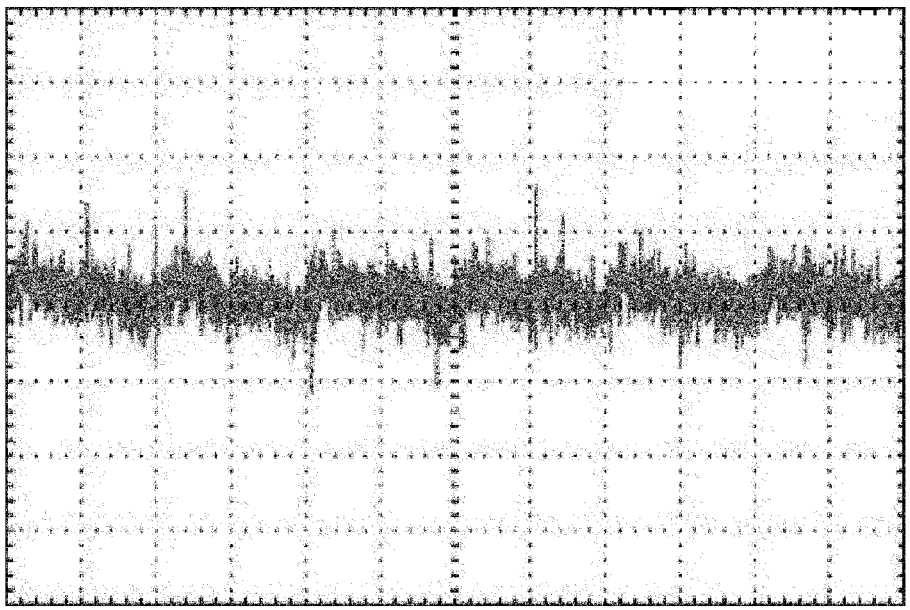
FIG. 9B shows measuring a residual noise of the single ground terminal in the vacuum tube audio amplifier of the present invention according to the measurement circuit structure, and the vacuum tube audio amplifier does not include a filament voltage regulator circuit.

A comparison of FIGS. 9A and 9B shows under the same condition (as in FIG. 4) the difference in the waveforms of the residual noise at the single ground terminal between when the DC power source B2 supplies power to the vacuum tube G1 through an anti-coupling circuit and when the DC power source B2 directly supplies power to the vacuum tube G1, wherein the resistor R2 is on the order of 10 KΩ; the resistor R1 is on the order of 90 KΩ; the resistor R10 is on the order of 100 KΩ; a 12AX7 vacuum tube G1 is adopted; a resistor R11 is on the order of 33 KΩ; a resistor R12 is on the order of 1.5 KΩ; a capacitor C13 is an electrolytic capacitor on the order of 22 uF; and a resistor R14 is on the order of 1 MΩ.

FIG. 9A shows in the conventional vacuum tube audio amplifier, measuring a residual noise of a single ground terminal, wherein the capacitor C1 is removed; that is, the arrangement as previously described, which is after canceling the structure of the RC anti-coupling circuit 80, FIG. 9A clearly displays the residual noise waveforms at the single ground terminal accompanied by a P-P level on the order of 27.6 mV.

FIG. 9B shows measuring a residual noise of the single ground terminal in the vacuum tube audio amplifier of the present invention according to the measurement circuit structure, and the vacuum tube audio amplifier does not include a filament voltage regulator circuit, wherein the capacitor C1 on the order of 22 uF is configured with a resistor R2 to form a RC anti-coupling circuit 80; and as the previously described arrangement, FIG. 9B clearly shows the residual noise at the single ground terminal is lowered to 22.8 mV.

Figure 10:
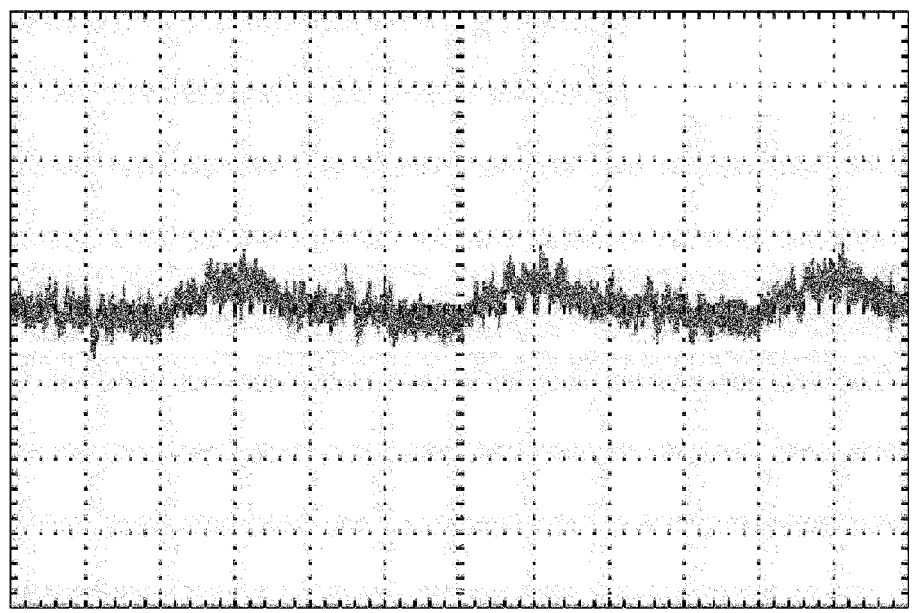
FIG. 10 shows in the vacuum tube audio amplifier of the present invention according to the measurement circuit structure, measuring an ultimate residual noise of the single ground terminal.

The present invention further provides adding a filament voltage regulator circuit, wherein the circuit is as the filament voltage regulator circuit 90 illustrated in FIG. 6, wherein a LM7806 voltage regulator circuit is adopted; the capacitor C93 is on the order of 104 pF; the capacitor C91 is an electrolytic capacitor on the order of 470 uF; the capacitor C92 is an electrolytic capacitor on the order of 1000 uF; and the capacitor C94 is on the order of 104 pF. FIG. 10 shows in the vacuum tube audio amplifier of the present invention according to the measurement circuit structure, measuring an ultimate residual noise of the single ground terminal. FIG. 10 clearly shows with such configuration, the residual noise at the single ground terminal is further reduced to 12 mV.

Based on the previous description, a grounding structure and method of the vacuum tube audio amplifier of the present invention is provided, which, with respect to grounding, adopts two single ground terminals and cancels the grounding metal bottom plate; and with respect to power source, the previously described three circuits and improvement thereof are collocated to substantially reduce the residual noise, so as to realize a light-weight, desktop model of the vacuum tube audio amplifier. Compared to the conventional vacuum tube audio amplifier that requires a grounding metal bottom plate that results in huge volume of the apparatus and even power leakage, the grounding structure and method of the vacuum tube audio amplifier according to the present invention has obvious enhancing effect.

A person having common knowledge in the art could understand, the above-disclosed content clearly reveals the purpose and effect of the present invention and are by no means limiting. Moreover, the components described herein may be replaced by those with similar functions; for example, substituting the LM7806 voltage regulator with other circuitry that can generate steady DC power source. Such simple replacement may achieve predictable effects of the present invention and may not be deemed departing from the spirit and scope of the present invention.

What is claimed is:

1. A grounding structure of a vacuum tube audio amplifier, the vacuum tube audio amplifier being used for providing an output signal according to an input signal and comprising a power circuit to supply power to a vacuum tube amplifying circuit and an audio output transforming circuit, the vacuum tube amplifying circuit amplifying the input signal and transmitting it to the audio output transforming circuit, the audio output transforming circuit providing the output signal to a loudspeaker, the grounding structure for the vacuum tube audio amplifier being characterized in that:
    the vacuum tube audio amplifier uses a negative output terminal of the audio output transforming circuit or a negative terminal of a filter capacitor in the power circuit as a single ground terminal;
    the single ground terminal is not coupled to a grounding metal bottom plate; and
    through a filament voltage regulator circuit, supplying power to a filament of a vacuum tube in the vacuum tube amplifying circuit;
    wherein a positive terminal of the filter capacitor is coupled to a positive terminal of an output voltage of the power circuit, and an inductance value of the filter capacitor is greater than 100 uF.

2. The grounding structure of the vacuum tube audio amplifier of claim 1, wherein the power circuit does not have a choke and is utilized to supply power to the vacuum tube amplifying circuit through an anti-coupling circuit.

3. The grounding structure of the vacuum tube audio amplifier of claim 2, wherein the power circuit supplies power to a first vacuum tube of a first amplifier stage in the vacuum tube amplifying circuit through the anti-coupling circuit.

4. The grounding structure of the vacuum tube audio amplifier of claim 3, wherein the anti-coupling circuit includes: an output terminal of the power circuit being coupled to a terminal of a fifth resistor; the other terminal of the fifth resistor being coupled to a terminal of a third capacitor; the other terminal of the third capacitor being coupled to the single ground terminal; and a terminal of the fifth resistor being coupled to a plate of the first vacuum tube through at least one resistor.

5. The grounding structure of the vacuum tube audio amplifier of claim 2, wherein the filament voltage regulator circuit includes: a positive terminal of a second rectifier being coupled to a terminal of a fourth capacitor, a terminal of a fifth capacitor and an input terminal of a voltage regulator circuit; an output terminal of the voltage regulator circuit being coupled to a terminal of a sixth capacitor and a terminal of a seventh capacitor; and the other terminals of the fourth, sixth, fifth and seventh capacitors, and a ground terminal of the voltage regulator circuit being coupled to the single ground terminal.

6. The grounding structure of the vacuum tube audio amplifier of claim 5, wherein the voltage regulator circuit may be an LM7806 voltage regulator integrated circuit.

7. The grounding structure of the vacuum tube audio amplifier of claim 5, wherein the voltage regulator circuit may be a low dropout regulator (LDO).

8. The grounding structure of the vacuum tube audio amplifier of claim 1, wherein the power circuit includes: a terminal of a first resistor, a terminal of a second resistor, and a terminal of a first capacitor being coupled to a positive output terminal of a first rectifier; the other terminal of the second resistor, the positive terminal of the filter capacitor, and a terminal of a third resistor being coupled to the positive terminal of the output voltage; the other terminal of the third resistor being coupled to a terminal of a second capacitor and a terminal of a fourth resistor; and the other terminal of the first resistor, the fourth resistor, the first capacitor, and the second capacitor, the negative terminal of the filter capacitor, and a negative output terminal of the first rectifier being coupled to the single ground terminal.

9. A grounding method of a vacuum tube audio amplifier, the vacuum tube audio amplifier being used to provide an output signal according to an input signal and comprising a power circuit for supplying power to a vacuum tube amplifying circuit and an audio output transforming circuit, the vacuum tube amplifying circuit amplifying the input signal and transmitting it to the audio output transforming circuit, the audio output transforming circuit providing the output signal to a loudspeaker, the grounding method including:
    using a negative output terminal of the audio output transforming circuit or a negative terminal of a filter capacitor in the power circuit as a single ground terminal of the vacuum tube audio amplifier;
    not coupling the single ground terminal to a grounding metal bottom plate; and
    configuring a filament voltage regulator circuit for supplying power to a filament of a vacuum tube in the vacuum tube amplifying circuit
    wherein a positive terminal of the filter capacitor is coupled to a positive terminal of an output voltage of the power circuit, and an inductance value thereof is greater than 100 uF.

10. The grounding method of the vacuum tube audio amplifier of claim 9, wherein the power circuit does not have a choke and is used to supply power to the vacuum tube amplifying circuit through an anti-coupling circuit.

11. The grounding method of the vacuum tube audio amplifier of claim 10, comprising configuring the power circuit to supply power through the anti-coupling circuit to a first vacuum tube in a first amplifier stage of the vacuum tube amplifying circuit.

12. The grounding method of the vacuum tube audio amplifier of claim 11, comprising configuring the anti-coupling circuit to include: an output terminal of the power circuit being coupled to a terminal of a fifth resistor; the other terminal of the fifth resistor being coupled to a terminal of a third capacitor; the other terminal of the third capacitor being coupled to the single ground terminal; and a terminal of the fifth resistor being coupled to a plate of the first vacuum tube through at least one resistor.

13. The grounding method of the vacuum tube audio amplifier of claim 10, comprising configuring the filament voltage regulator circuit to include: a positive terminal of a second rectifier being coupled to a terminal of a fourth capacitor, a terminal of a fifth capacitor, and an input terminal of a voltage regulator circuit; an output terminal of the voltage regulator circuit being coupled to a terminal of a sixth capacitor and a terminal of a seventh capacitor; and the other terminals of the fourth, sixth, fifth and seventh capacitors, and a ground terminal of the voltage regulator circuit being coupled to the single ground terminal.

14. The grounding method of the vacuum tube audio amplifier of claim 9, comprising configuring the power circuit to include: a terminal of a first resistor, a terminal of a second resistor, and a terminal of a first capacitor being coupled to a positive output terminal of a first rectifier; the other terminal of the second resistor, the positive terminal of the filter capacitor and a terminal of a third resistor being coupled to the positive terminal of the output voltage; the other terminal of the third resistor being coupled to a terminal of a second capacitor and a terminal of a fourth resistor; and the other terminals of the first resistor, the fourth resistor, the first capacitor, and the second capacitor, the negative terminal of the filter capacitor, and a negative output terminal of the first rectifier being coupled to the single ground terminal.

* * * * *